(12) United States Patent
Harada et al.

(10) Patent No.: US 7,816,648 B2
(45) Date of Patent: Oct. 19, 2010

(54) ELECTRON INTERFEROMETER OR ELECTRON MICROSCOPE

(75) Inventors: Ken Harada, Wako (JP); Tetsuya Akashi, Fujimi (JP); Yoshihiko Togawa, Wako (JP); Tsuyoshi Matsuda, Wako (JP)

(73) Assignee: Riken, Saitama (JP)

( * ) Notice: Subject to any disclaimer, the term of this patent is extended or adjusted under 35 U.S.C. 154(b) by 382 days.

(21) Appl. No.: 11/547,054

(22) PCT Filed: Mar. 7, 2005

(86) PCT No.: PCT/JP2005/003865

§ 371 (c)(1),
(2), (4) Date: Aug. 6, 2008

(87) PCT Pub. No.: WO2005/098896

PCT Pub. Date: Oct. 20, 2005

(65) Prior Publication Data

US 2008/0302965 A1 Dec. 11, 2008

(30) Foreign Application Priority Data

Mar. 31, 2004 (JP) .............................. 2004-102530

(51) Int. Cl.
*G01B 15/00* (2006.01)
(52) U.S. Cl. ...................... 250/311; 250/306; 250/307; 250/309; 250/310; 250/492.1; 250/492.3; 356/28.5
(58) Field of Classification Search ................. 250/306, 250/307, 309–311, 492.1, 492.3; 356/28.5
See application file for complete search history.

(56) References Cited

U.S. PATENT DOCUMENTS 4,998,788 A * 3/1991 Osakabe et al. ................ 359/1

(Continued)

FOREIGN PATENT DOCUMENTS

JP 57-060648 4/1982

(Continued)

OTHER PUBLICATIONS

Ru et al, "Electron Holography Available in a Non-Biprism Transmission Electron Microscope", Ultramicroscopy Letter 53, © 1994 Elsevier Science B.V.
Harada et al, "Profile Structure of Magnetic Flux Lines in Type-II Superconductor from a Rectangular Electron Hologram", Journal of Electron Microscopy 52(4): 36-373, 2003, pp. 369-373.

(Continued)

*Primary Examiner*—Jack I Berman
*Assistant Examiner*—Meenakshi S Sahu
(74) *Attorney, Agent, or Firm*—Nixon & Vanderhye P.C.

(57) ABSTRACT

In an electron beam interference system using an electron biprism, which is capable of independently controlling each of the interference fringe spacing s and the interference width W, both of which are important parameters for an interferometer and for an interferogram acquired by the interferometer, an optical system used in a two-stage electron biprism interferometer is adopted. The optical system uses two stages of electron biprisms in an optical axis direction to give the flexibility to the relative magnification relative to a specimen image and that relative to an image of a filament electrode of the electron biprism. In addition, as a two-stage configuration in which two objective lenses (51, 52) are combined, independently controlling the focal length of each objective lens makes it possible to set the relative magnification relative to a specimen image and that relative to an image of the filament electrode of the electron biprism at arbitrary values.

30 Claims, 11 Drawing Sheets

U.S. PATENT DOCUMENTS

| | | | |
|---|---|---|---|
| 5,466,548 A * | 11/1995 | Matsui | 430/1 |
| 6,759,656 B2 * | 7/2004 | Tomita | 250/311 |
| 7,538,323 B2 * | 5/2009 | Harada et al. | 250/310 |
| 2003/0160969 A1 | 8/2003 | Endo et al. | |
| 2004/0144923 A1 | 7/2004 | Tanji | |
| 2008/0258058 A1 * | 10/2008 | Harada et al. | 250/310 |

FOREIGN PATENT DOCUMENTS

| | | |
|---|---|---|
| JP | 1-264151 A | 10/1989 |
| JP | 2-186547 A | 7/1990 |
| JP | 07-320674 | 12/1995 |
| JP | 10-199464 A | 7/1998 |
| JP | 2002-117795 | 4/2002 |
| JP | 2002-117800 A | 4/2002 |

OTHER PUBLICATIONS

Harada et al, "A New FFT for Numerical Reconstruction in Electron Holography", J Electron Microsc 40: 92-96, 1991, pp. 92-96.

Zernike, "The Concept of Degree of Coherence and Its Application to Optical Problems", Physica V, No. 8, Aug. 1938, pp. 785-795.

Thompson et al, "Two-Beam Interference with Partially Coherent Light", Journal of the Official Society of America, vol. 47, No. 10, Oct. 1957, pp. 895-902.

Speidel et al, "Richtstrahlwertmessungen an einem Strahlerzeugungssystem mit Feldemissionskathode", Optik, 49, No. 2, 1977, pp. 178-185.

Harada et al, "Optical Simulation for Electron Holography", Technology Reports of the Osaka University, vol. 39, No. 1960, Oct. 1989, pp. 117-128.

International Search Report mailed Jun. 7, 2005 in corresponding PCT Application No. PCT/JP2005/003865.

* cited by examiner

ELECTRON INTERFEROMETER OR ELECTRON MICROSCOPE

This application is the US national phase of international application PCT/JP2005/003865 filed 3 Jul. 2005, which designated the U.S. and claims priority to JP 2004-102530 filed 31 Mar. 2004, the entire contents of each of which are hereby incorporated by reference.

FIELD OF THE INVENTION

The present invention relates to wavefront-splitting type electron interferometers, each of which uses electron biprisms, and to wavefront-splitting type electron microscopes.

BACKGROUND OF THE INVENTION

Optical interferometers are roughly classified into optical interferometers based on amplitude-splitting and those based on wavefront-splitting. However, as far as electron interferometers are concerned, only the wavefront-splitting type interferometers, each of which uses one electron biprism, are brought into actual use. This type of interferometer cannot independently control the interference fringe spacing s and the interference width W in principle. Therefore, if the wide interference width is required, for example, in the case of a large specimen, an interferogram (hologram), whose interference fringe spacing is narrow, and which is composed of a large number of interference fringes, must be analyzed. As a result of this, an image recorded with the high carrier-spatial frequency had to be analyzed. In contrast with this, even if an interferogram with the high carrier-spatial frequency is required in a narrow space because a specimen is small, when the required high carrier-spatial frequency is reached, the interference width becomes wider, causing the spatial coherence to be degraded. Accordingly, a low quality interferogram composed of low-contrast interference fringes had to be analyzed.

With the objective of addressing these problems, the inventors of the present invention applied for the invention of PCT/JP2005/000111. FIG. 1 is a diagram illustrating an interference system that uses electron biprisms described in FIG. 3 of PCT/JP2005/000111. This will be roughly described here as the background art of the application concerned.

In FIG. 1, reference numeral 1 denotes an electron source; reference numeral 2 denotes an optical axis; reference numeral 3 denotes a specimen; reference numeral 5 denotes an objective lens; reference numeral 7 denotes an image plane of an electron source over the upper electron biprism; reference numeral 11 denotes an observation plane; reference numeral 12 denotes an image of a specimen on an observation plane; and reference numeral 13 denotes an image recording device such as film and a camera. Reference numerals 21 and 23 denote an object wave and a reference wave respectively. Reference numeral 31 denotes an image plane of a specimen determined by the objective lens 5; reference numeral 32 denotes an image of a specimen formed by the objective lens 5; reference numeral 33 denotes a magnifying lens; reference numeral 35 denotes an image plane of an electron source determined by the magnifying lens 33; and reference numeral $9_u$ denotes a filament electrode of an upper electron biprism that is placed on the image plane 31 of a specimen determined by the objective lens 5, and a diameter of the filament electrode $9_u$ is $d_u$. Reference numeral $9_b$ denotes a filament electrode of a lower electron biprism that is placed between the image plane 35 of the electron source determined by the magnifying lens 33 and the observation plane 11. A diameter of the filament electrode $9_b$ is $d_b$. In addition, the interference fringe spacing s and interference width W appearing on the observation plane 11 are schematically illustrated below the image recording device 13. Here, in the figure, although the electron source 1 is shown as a single block, the block includes a source, an acceleration tube, and a condenser optical system. The electron biprism schematically illustrated here is an electric field type. This electron biprism is constructed of a filament electrode located in the center, and right and left grounded electrodes located far outside an area through which an electron beam near the central filament electrode passes. An electron beam is deflected by applying the voltage to the central filament electrode. FIG. 1 and figures thereafter illustrate only a cross section of the central filament electrode with a small circle. In addition, in the description in which a function of an electron biprism is paid attention to, it is expressed only as an electron biprism. Further, in the description in which the central filament electrode is paid attention to, the central filament electrode is expressed as a filament electrode of an electron biprism. Moreover, because electron optical systems usually use a magnetic-field-type lens as an electron lens, said an electro-magnetic lens, a path of an electron beam includes the azimuth rotation whose rotation center is an optical axis. However, an identical plane is illustrated in FIG. 1 as an electron optical system with the azimuth rotation of an electron beam caused by the electromagnetic lens being disregarded. The figures thereafter, each illustrating an optical system, are also treated in the same manner.

An electron beam generated by the electron source 1 is divided into the object wave 21 passing through a specimen 3 located on the one side of the optical axis 2, and the reference wave 23 passing through the other side of the optical axis 2 where the specimen 3 does not exist. For easier identification of the object wave 21 and the reference wave 23, only the object wave 21 is provided with pattern display. The object wave 21 and the reference wave 23 are refracted by the objective lens 5, and then intersect each other at the image plane 7 of an electron source over an upper electron biprism to travel towards the magnifying lens 33. The object wave 21 and the reference wave 23 form the specimen image 32 on the image plane 31 of the specimen, the image plane 31 being determined by the objective lens. In addition, the object wave 21 and the reference wave 23 pass through a position of the upper electron biprism on the image plane 31. The deflection by the voltage applied to the filament electrode $9_u$ of the upper electron biprism causes each electron beam to go towards the optical axis 2. Reference numerals 25 and 27 denote virtual electron-source images of both the object wave 21 and the reference wave 23, which are deflected by the filament electrode $9_b$ of the lower electron biprism. Reference numerals 26 and 28 denote real electron source images of both the object wave 21 and the reference wave 23, which are deflected by the filament electrode $9_u$ of the upper electron biprism. $Y_r$ is the split distance from an optical axis to the electron source image 26 or 28 caused by the deflection by the filament electrode $9_u$ of the upper electron biprism. $Y_v$ is the split distance from the real electron-source image 26 to the virtual electron-source image 25 caused by the deflection by the filament electrode $9_b$ of the lower electron biprism. $Y_r$ and $Y_v$ are expressed by equations (1), (2) as follows.

[Equation 1]

$$Y_r = \frac{b_3}{a_3} \cdot \alpha_u(b_{Obj} - b_1) = \frac{b_3}{a_3} \cdot \alpha_u D_u \tag{1}$$

[Equation 2]

$$Y_v = \alpha_b(b_M - b_3 - L_b) = \alpha_b(D_b - L_b) \tag{2}$$

Because an observation plane 11 is an image plane of the filament electrode $9_u$ of the upper electron biprism, the deflection by the upper electron biprism does not influence the image formation. Accordingly, no wavefront overlap occurs. However, because the deflection to the electron beam actually works, splits 26 and 28 of the real electron-source images occur. These are essentially the same as splits 25 and 27 of the virtual electron-source images by the filament electrode $9_b$ of the lower electron biprism.

When both of the biprisms $9_u$ and $9_b$ simultaneously work in the configuration shown in FIG. 1, interference fringes which are reversely projected on a specimen surface are expressed by equations (3), (4). Hereinafter, the interference fringe spacing s and interference width W which are reversely projected on the specimen surface are expressed with a subscript Obj.

[Equation 3]

$$s_{Obj} = \frac{a_M}{b_M} \cdot \frac{a_{Obj}}{b_{Obj}} \cdot \frac{D_b \lambda}{Y_v + Y_u} q \quad (3)$$

$$= \frac{a_M}{b_M} \cdot \frac{a_{Obj}}{b_{Obj}} \cdot \frac{a_3(b_M - b_3)\lambda}{2\{\alpha_b a_3(b_M - b_3 - L_b) + \alpha_u b_3(b_{Obj} - b_1)\}}$$

$$= \frac{1}{M_M} \cdot \frac{1}{M_{Obj}} \cdot \frac{a_3 D_b \lambda}{2\{\alpha_b a_3(D_b - L_b) + \alpha_u b_3 D_u\}}$$

[Equation 4]

$$W_{Obj} = \frac{a_M}{b_M} \cdot \frac{a_{Obj}}{b_{Obj}} \cdot \frac{2Y_v L_b}{D_b - L_b} - \frac{a_{Obj}}{b_{Obj}} d_u \quad (4)$$

$$= \frac{a_M}{b_M} \cdot \frac{a_{Obj}}{b_{Obj}} \cdot 2\alpha_b L_b - \frac{a_{Obj}}{b_{Obj}} d_u$$

$$= \frac{1}{M_M} \cdot \frac{1}{M_{Obj}} \cdot 2\alpha_b L_b - \frac{1}{M_{Obj}} d_u$$

The equations (3) and (4) mean that the interference width $W_{Obj}$ does not depend on the deflection angle $\alpha_u$ formed by the upper electron biprism. This makes it possible to independently control the interference fringe spacing $s_{Obj}$ and the interference width $W_{Obj}$. To be more specific, the independent control becomes possible by the steps of:

(1) for the lower electron biprism, determining the interference width $W_{Obj}$; and (2) for the upper electron biprism, adjusting the interference fringe spacing $s_{Obj}$.

Moreover, when considering a case where the filament electrode $9_b$ of the lower electron biprism is placed at a position of the image plane 35 of the electron source determined by the magnifying lens 33 ($D_b - L_b = 0$), the interference fringe spacing $s_{Obj}$ does not depend on the deflection angle $\alpha_b$ according to the equation (3). To be more specific, under these optical conditions, the interference fringe spacing $s_{Obj}$ and the interference width $W_{Obj}$ can be completely and independently controlled.

SUMMARY OF THE INVENTION

As a result of the invention of PCT/JP2005/000111, an electron interferometer capable of independently controlling the interference fringe spacing $s_{Obj}$ and the interference width $W_{Obj}$ could be realized. However, electron microscopes usually have the structure in which all of a specimen, an objective lens, and a filament electrode of an electron biprism are hardly moved in the axial direction of an optical axis. Therefore, in the conventional imaging optical system shown in FIG. 1, which uses two stages of electron biprisms, use conditions of the objective lens are substantially uniquely determined, which results in no flexibility. To be more specific, the specimen is magnified only by the magnification $b_{Obj}/a_{Obj}$ of the objective lens and is projected on the image plane 31 of the specimen determined by the objective lens, which corresponds to a position of the filament electrode $9_u$ of the upper electron biprism. The use conditions are uniquely determined in this state. The relative size of the image 32 of a specimen to be observed and the relative size of the filament electrode $9_u$ of the upper electron biprism are also determined under these conditions. This was the great disadvantage of electron microscopes in which mechanical positions including a position of a lens cannot be freely changed.

In the interference system that uses an electron biprism, an image of a filament electrode of the electron biprism or a shadow of the filament electrode is an unobservable area. The size of this area directly influences the size and range of a specimen to be observed. In other words, it is necessary to freely select the relative size of the image of the specimen to be observed and the relative size of a filament image, or the relative size of the shadow of the filament electrode. The conventional imaging optical systems using two stages of electron biprisms take measures against the above problem by reconstructing the whole optical system of an electron microscope, or by replacing the filament electrode of the electron biprism with a filament electrode having an optimum diameter. However, reconstructing of the whole optical system is complicated, and a problem of causing the final magnification to be lowered arises. What is more, the size of the filament electrode of the electron biprism is smaller than or equal to a diameter of 1 μm, which exceeds the limit of visual inspection. Accordingly, the production and selection of an optimum filament electrode, and the replacement with the optimum filament electrode, involve the great technical difficulty.

The relative size of a selected area aperture relative to a specimen image, which is projected at an aperture position, is also the effective size. Therefore, several kinds of apertures, each of which has a diameter corresponding to the magnification of each objective lens, are provided on the equipment side. An operator selects a proper aperture from among the apertures to use the selected one. As described above, because use conditions of an objective lens are uniquely determined, even in the case of fine-tuning of an aperture diameter, it was technically difficult to change the size on the spot during an experiment. Furthermore, if observation conditions greatly differ, an aperture having a different diameter must be set in an electron microscope beforehand. For this purpose, it was necessary to release a vacuum of a microscope case.

The present invention has been made to solve the above problems. According to the present invention, an objective lens 5 to be placed under a specimen 3 to be observed is configured as a combined lens system formed of two stages of objective lenses. By independently adjusting the focal length of each objective lens, it is possible to freely change the relative magnification of the specimen to be observed and that of an upper filament electrode without adjusting an imaging lens other than the objective lens. To be more specific, an objective lens is formed of two stages of lens systems so that the flexibility including not only magnification but also demagnification is given to the magnification of a specimen image to be imaged on the image plane 31 where the filament electrode $9_u$ of the upper electron biprism is located. Then, the filament electrode $9_b$ of the lower electron biprism is placed between the image plane of an electron source 35 determined by the magnifying lens 33 and the observation plane 11.

Completely the same measures can also be taken for the relative magnification relative to a selected area aperture. More specifically, if the selected area aperture is located on the image plane 31 of the specimen, it is possible to arbitrarily set the relative magnification relative to the aperture and the relative magnification relative to the specimen by independently adjusting each of two stages of objective lenses.

EFFECTS OF THE INVENTION

According to the present invention, it is possible to freely change the relative magnification of an image of a specimen to be observed and that of a filament electrode of an upper electron biprism without adjusting an imaging lens other than an objective lens of an electron interferometer. Therefore, it is possible to arbitrarily control a range of a filament shadow of the filament electrode of the electron biprism, which is formed on the specimen, that is to say, the width of an unobservable area, without changing the size of the filament electrode $9_u$ of the upper electron biprism. Also on the conventional electron biprisms using one interferometer, the same effects can be expected.

Moreover, if the filament electrode $9_u$ of the upper electron biprism is replaced with a selected area aperture, it is immediately understood that what is configured is an optical system capable of freely changing the relative magnification of a specimen to be observed and the relative magnification of the selected area aperture. This means that the optical system is capable of freely and relatively setting a diameter of a selected area aperture from an electron optical point of view. This shows that unlike the conventional selected area aperture, it is not necessary to prepare a plurality of apertures, each of which has a different diameter. In other words, the present invention is effective even for an electron beam optical system that does not involve interference.

DESCRIPTION OF PREFERRED EMBODIMENT

Figure 1:
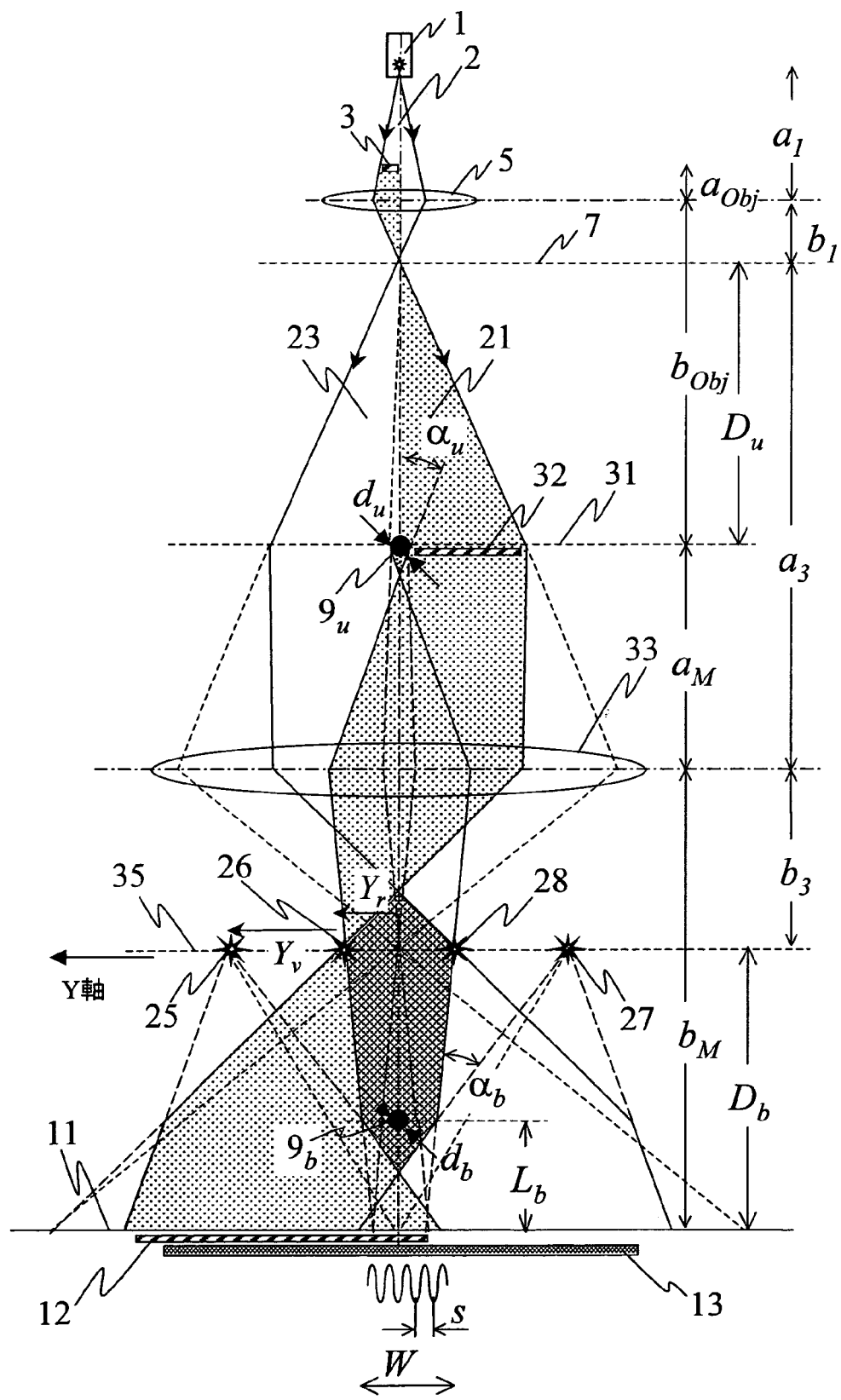
FIG. 1 is a diagram illustrating an interference system that uses two stages of electron biprisms described in FIG. 3 of PCT/JP2005/000111.
Figure 2:
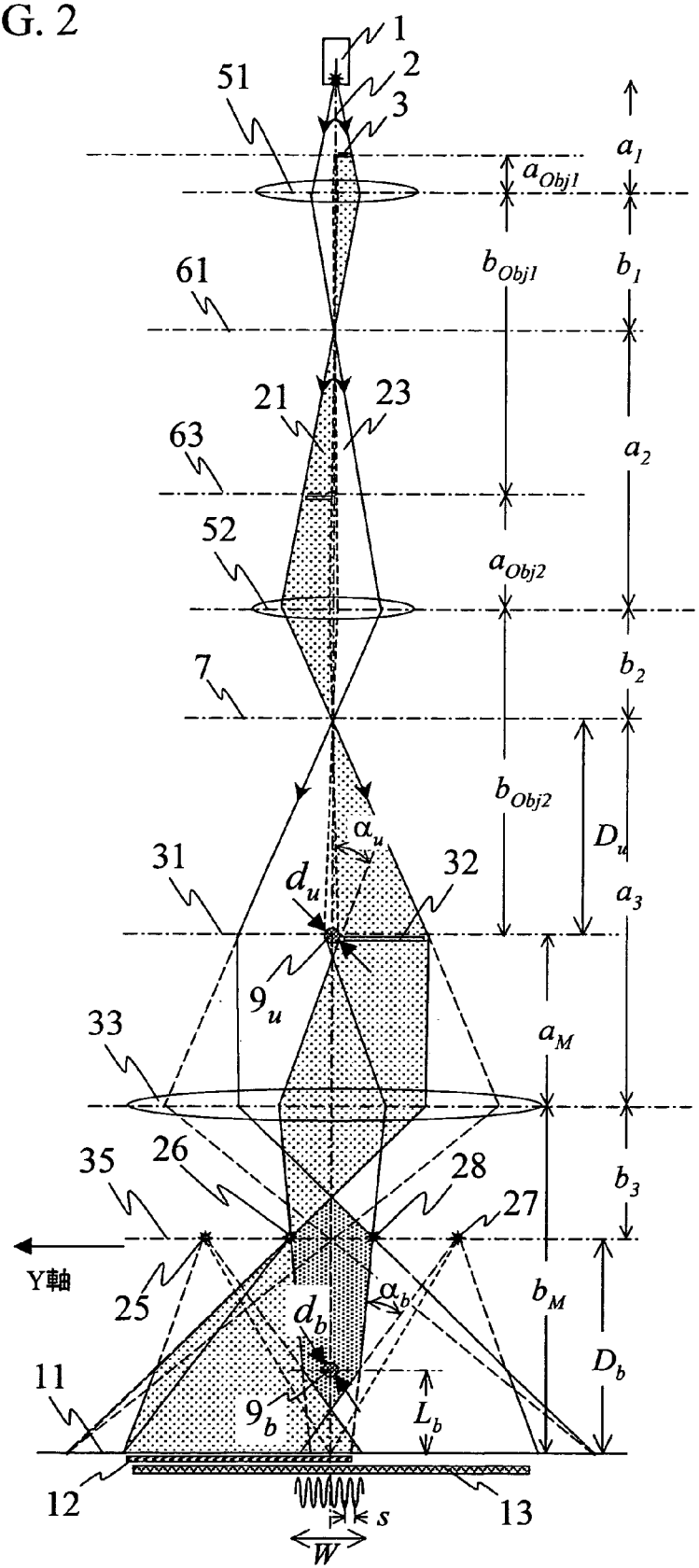
FIG. 2 is a diagram illustrating an interference system of an electron interferometer according to an embodiment of the present invention, in which an objective lens is formed of two stages of imaging lens systems.

FIG. 2 is a diagram illustrating an interference system of an electron interferometer according to an embodiment of the present invention, in which an objective lens is formed of two stages of lens systems. The point that the electron beam interference is controlled by use of two stages of electron biprisms is the same as that shown in FIG. 1.

In FIG. 2, reference numeral 51 denotes a first objective lens; reference numeral 52 denotes a second objective lens; reference numeral 61 denotes an image plane of an electron source 1 determined by the first objective lens 51; and reference numeral 63 denotes an image plane of a specimen 3 determined by the first objective lens 51. The structure after the image plane 7 of the electron source 1, which is formed on the downstream side in a traveling direction of an electron beam passing through the second objective lens 52, is the same as that shown in FIG. 1. To be more specific, taking as an example an optical system in which a specimen is located in the image plane 63 shown in FIG. 2, the optical system is equivalent to the equipment shown in FIG. 1. As is clear from the comparison between FIGS. 1 and 2, as a result of newly adding a lens between a specimen and an electron interferometer, the optical system according to the present invention (shown in FIG. 2) has an objective lens constructed of two stages of lens systems. Accordingly, the flexibility of the relationship between the specimen and the interferometer is improved by arbitrarily controlling the focal length of each lens. Electron beam equipment is set into vacuum, and accordingly it is difficult to move a mechanical position. Therefore, the electron beam equipment is in general lacking in the mechanical flexibility of optical parameters. The above configuration compensates the lack of the flexibility.

According to the configuration shown in FIG. 2, interference fringes appearing when both biprisms simultaneously work are expressed by equations (5), (6).

[Equation 5]

$$s_{Obj} = \frac{a_{Obj1}}{b_{Obj1}} \cdot \frac{a_{Obj2}}{b_{Obj2}} \cdot \frac{a_M}{b_M} \cdot \frac{a_3(b_M - b_3)\lambda}{2\{\alpha_b a_3(b_M - b_3 - L_b) + \alpha_u b_3(b_{Obj2} - b_2)\}} \quad (5)$$

$$= \frac{1}{M_{Obj1}} \cdot \frac{1}{M_{Obj2}} \cdot \frac{1}{M_M} \cdot \frac{a_3 D_b \lambda}{2\{\alpha_b a_3(D_b - L_b) + \alpha_u b_3 D_u\}}$$

[Equation 6]

$$W_{Obj} = \frac{a_{Obj1}}{b_{Obj1}} \left\{ \frac{a_{Obj2}}{b_{Obj2}} \cdot \frac{a_M}{b_M} \cdot 2\alpha_b L_b - \frac{a_{Obj2}}{b_{Obj2}} d_u \right\} \quad (6)$$

$$= \frac{1}{M_{Obj1}} \left\{ \frac{1}{M_{Obj2}} \cdot \frac{1}{M_M} \cdot 2\alpha_b L_b - \frac{1}{M_{Obj2}} d_u \right\}$$

The equations (5) and (6) are expressed in a manner that the equations (5) and (6) can be contrasted with the equations (3) and (4). As is clearly understood from them, the whole equations (3) and (4) are multiplied by the magnification $M_{Obj1}$ provided by the first objective lens 51. This can be easily understood if the fact is taken into consideration that the specimen is not actually located on the image plane 63 of the specimen but at a position above the first objective lens 51.

Figure 3:
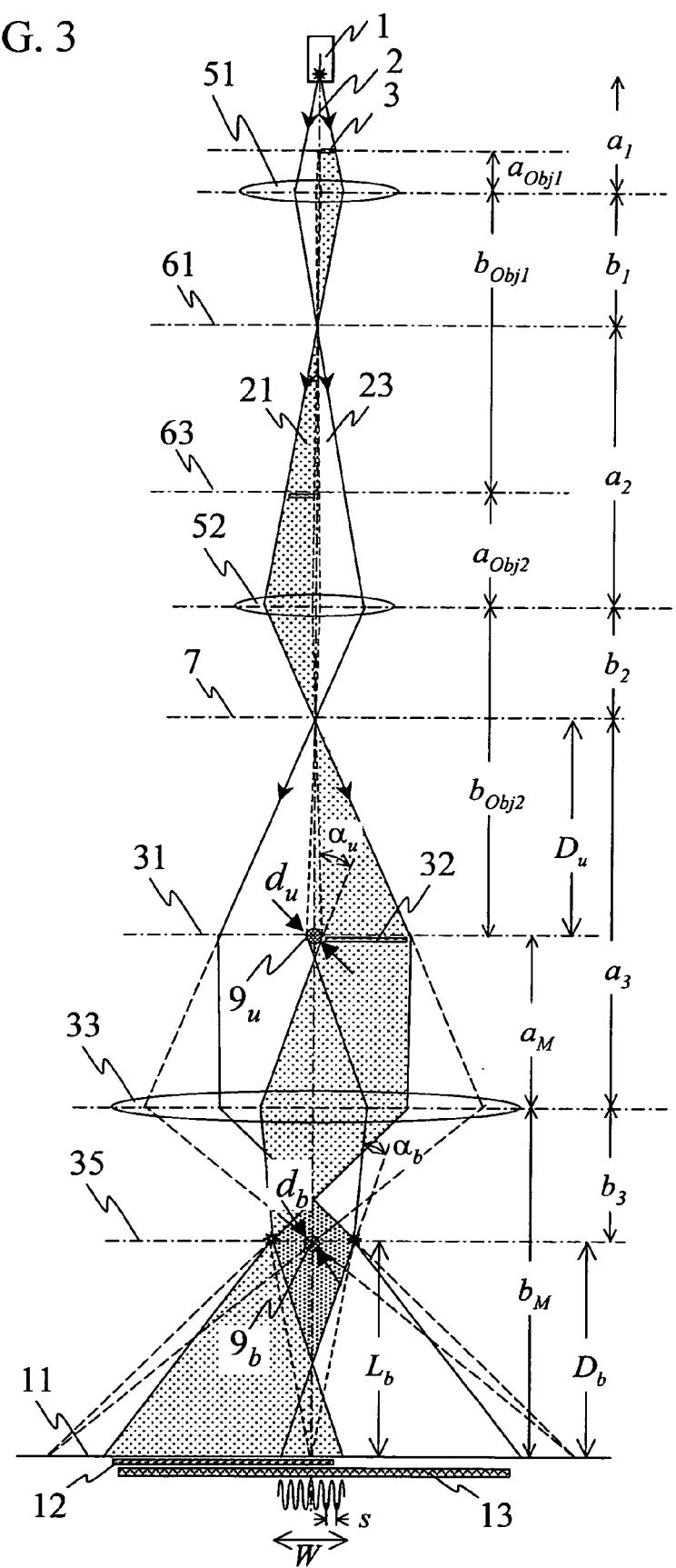
FIG. 3 is a diagram illustrating an interference system in which a filament electrode $9_b$ of a lower electron biprism is placed at a position at which $D_b = L_b$ in the configuration according to the embodiment of the present invention shown in FIG. 2.

FIG. 3 is a diagram illustrating an interference system in which a filament electrode $9_b$ of a lower electron biprism is placed at a position at which $D_b=L_b$ in the configuration according to the embodiment of the present invention shown in FIG. 2. In this case, interference fringes appearing when both biprisms simultaneously work are expressed by equations (7) and (8).

[Equation 7]

$$s_{Obj} = \frac{a_{Obj1}}{b_{Obj1}} \cdot \frac{a_{Obj2}}{b_{Obj2}} \cdot \frac{a_M}{b_M} \cdot \frac{a_3(b_M - b_3)\lambda}{2\alpha_u b_3(b_{Obj2} - b_2)} \quad (7)$$

$$= \frac{1}{M_{Obj1}} \cdot \frac{1}{M_{Obj2}} \cdot \frac{1}{M_M} \cdot \frac{a_3 D_b \lambda}{2\alpha_u b_3 D_u}$$

[Equation 8]

$$W_{Obj} = \frac{a_{Obj1}}{b_{Obj1}} \left\{ \frac{a_{Obj2}}{b_{Obj2}} \cdot \frac{a_M}{b_M} \cdot 2\alpha_b D_b - \frac{a_{Obj2}}{b_{Obj2}} d_u \right\} \quad (8)$$

$$= \frac{1}{M_{Obj1}} \left\{ \frac{1}{M_{Obj2}} \cdot \frac{1}{M_M} \cdot 2\alpha_b D_b - \frac{1}{M_{Obj2}} d_u \right\}$$

As is clearly understood from the equations (7) and (8), the interference fringe spacing $s_{Obj}$ depends only on the deflection angle $\alpha_u$ made by the upper electron biprism. On the other hand, the interference width $W_{Obj}$ depends only on the deflection angle $\alpha_b$ made by the lower electron biprism. To be more specific, it is shown that the interference fringe spacing $s_{Obj}$ and the interference width $W_{Obj}$ can be completely and independently controlled.

There is no difference between the configuration of the optical system illustrated in FIGS. 2 and 3 and the configuration of the optical system shown in FIG. 1 except that the optical system illustrated in FIGS. 2 and 3 has the objective lens constructed of two stages of lens systems, that is to say, the first objective lens 51 and the second objective lens 52. Therefore, if the combined magnification $M_{Obj}$ of two stages of the objective lenses is defined as $M_{Obj}=M_{Obj1} \times M_{Obj2}$, the equations (5) and (6) for describing the interference fringes also agree with the equations (3) and (4). These facts mean that no functional disadvantage is placed on the interference system according to the present invention shown in FIG. 1. To be more specific, an increase in flexibility which is newly brought by the objective lens system is reflected just as it is in an improvement in performance/operability of the equipment as an increase in flexibility of the interferometer and as the extension of a range of a target to be observed.

(Experimental Result)

Figure 4A:
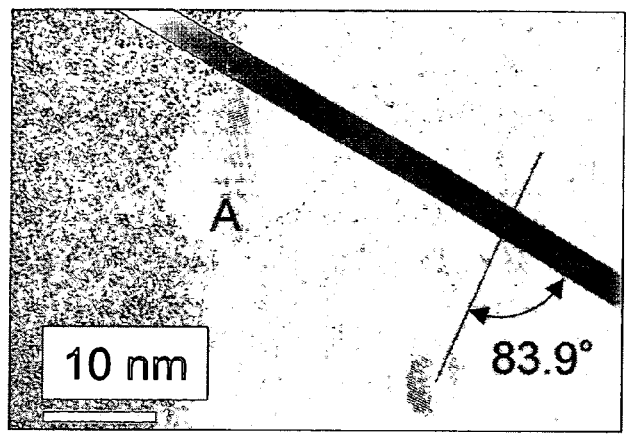
FIG. 4A is a photograph showing a filament electrode $9_u$ of an upper electron biprism, more specifically, imaging a specimen (gold fine particle) that is imaged with a magnification of 286 times on an image plane 31 of a second objective lens 52.
Figure 4B:
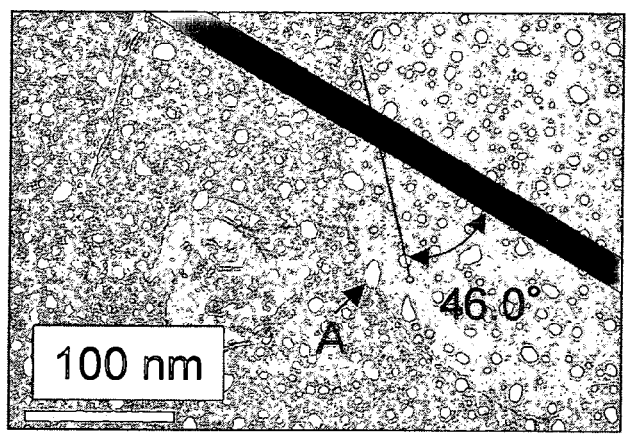
FIG. 4B is a photograph showing the filament electrode $9_u$ of the upper electron biprism, more specifically, imaging a specimen (gold fine particle) that is imaged with a magnification of 39 times on the image plane 31 of the second objective lens 52.
Figure 4C:
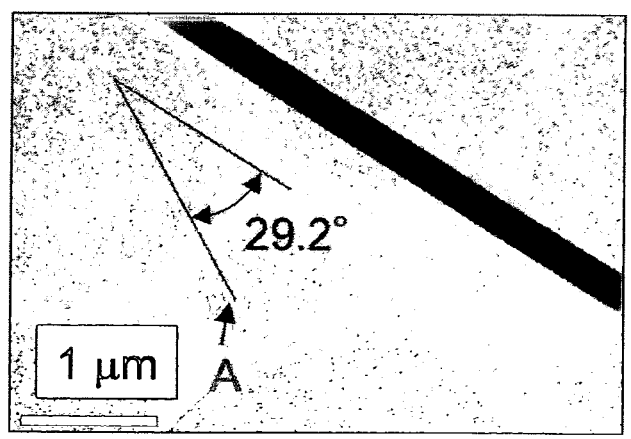
FIG. 4C is a photograph showing the filament electrode $9_u$ of the upper electron biprism, more specifically, imaging a specimen (gold fine particle) that is imaged with a magnification of 2.7 times on the image plane 31 of the second objective lens 52.

FIGS. 4A through 4C are photographs each illustrating the experimental result that is used to prove the effects of the objective lens constructed of the two stages of lens systems.

FIGS. 4A through 4C are photographs each illustrating a state in which an image of the filament electrode $9_u$ of the upper electron biprism is observed as a black belt-shaped shadow and in which gold fine particles on carbon thin film which is a specimen are observed as a pattern. In the figures, each character A indicates the same gold fine particle, and each additional line indicates a relative azimuth rotation angle between the specimen and the filament electrode of the electron biprism, the relative azimuth rotation angle being determined from the positional relationship of the observed fine particles.

FIG. 4A is a photograph showing the filament electrode $9_u$ of the upper electron biprism, more specifically, imaging a specimen (gold fine particle) that is imaged with a magnification of 286 times on the image plane 31 of the specimen, which is determined by the second objective lens 52. Sufficiently thin filament diameter is effectively obtained with respect to a real diameter of the filament electrode, which is 0.8 μm. In like manner, FIG. 4B is a photograph whose magnification is 39 times on the image plane 31 of the second objective lens 52, and FIG. 4C is a photograph whose magnification is 2.7 times on the image plane 31 of the second objective lens 52. While these images are photographed, both biprisms are kept in a non-working state. In addition, in all cases, the magnification of the magnifying lens 33 is the same; more specifically, the magnification is 4,200 times.

As is understood by comparing FIGS. 4A through 4C, it is found out that the gold fine particles become relatively smaller and at the same time the observed visual field becomes wider. The round structure shown in FIG. 4C is part of specimen support film, which is called a micro-grid. In FIGS. 4A through 4C, a position of the same specimen is observed with a position of the filament electrode $9_u$ of the upper electron biprism being kept at the same position. If conditions of the optical system for the filament electrode $9_u$ are kept constant, it is apparent that the thickness and position of an image of the filament electrode $9_u$ do not change.

As is the case with the image of the filament electrode of the electron biprism, the interference fringe spacing $s_{Obj}$ and interference width $W_{Obj}$ at the time of holography also relatively change in FIGS. 4A through 4C. In other words, observation conditions ranging from the high resolution (FIG. 4A) to the low magnification (FIG. 4C) can be achieved only by a combination of two stages of objective lenses.

Moreover, a relative azimuth angle between the specimen image and the image of the filament electrode of the electron biprism also changes. In this experimental example, both the relative magnification and relative azimuth angle of the specimen simultaneously change. This is caused by the method of using in which the magnification of the first objective lens is set at a value that is extremely higher than the magnification of the second objective lens. Therefore, if the magnification of the first and second objective lenses to be used is set at the same level, it is possible to arbitrarily control only the azimuth angle with the relative magnification being kept constant. More specifically, even if an electron biprism filament electrode or a specimen holder does not include an azimuth rotating mechanism, it is possible to control the relative azimuth angles by the method of using the two stages of objective lenses.

Moreover, by using the first objective lens 51 under high excitation (high expansion) conditions, a position 61 of an electron source image formed by the first objective lens can be fixed to a position in proximity to a back focal plane behind the first objective lens. As far as a holography optical system is concerned, if a position of a source changes, interference conditions (the interference width and the interference fringe spacing) also change. Accordingly, if the source can be fixed, it is not necessary to reset the interference conditions on the basis of observation conditions of a specimen, including the change of the observation magnification. This increases the flexibility of experiments, exactly.

Further, it is also possible to image a specimen by use of the second objective lens 52 with the first objective lens 51 being switched OFF or being kept at low excitation. This makes it possible to observe a specimen in a magnetic-field-free condition, and also enables holography observation of the magnetic domain structure of a magnetic material. Furthermore, because this forms a demagnifying system, it is also a wide-range holography observation optical system with low magnification.

(Application to an Electron Microscope Having a Selected Area Aperture)

Effects of the objective lens having the two-stage configuration on the filament electrode of the electron biprism has been described above. However, the objective lens having the two-stage configuration according to the present invention also has large effects on a selected area aperture.

If the conventional electron microscope uses a selected area aperture, the following measures are taken: providing the electron microscope with a plurality of apertures, each of which has a diameter that differs from the others; at the time of an experiment, selecting an aperture having a required diameter; and then placing the selected aperture on an optical axis. However, according to the present invention, without changing the aperture diameter of a selected area aperture, it is possible to make an aperture having a diameter that differs relative to the specimen size.

Figure 5A:
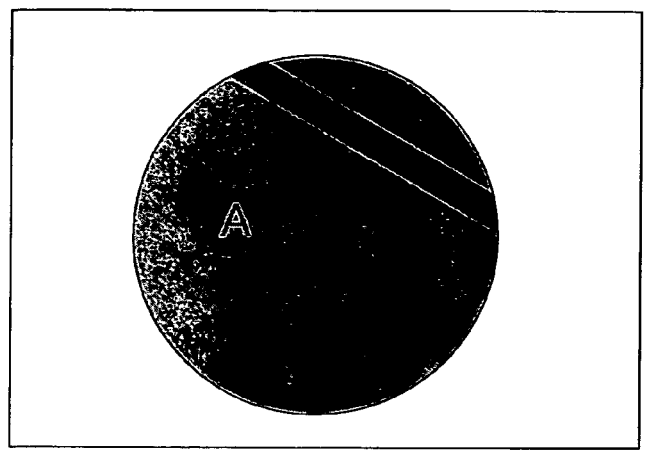
FIG. 5A is a photograph showing effects of application of the present invention to a selected area aperture, the figure being drawn using the experimental result shown in FIG. 4A.
Figure 5B:
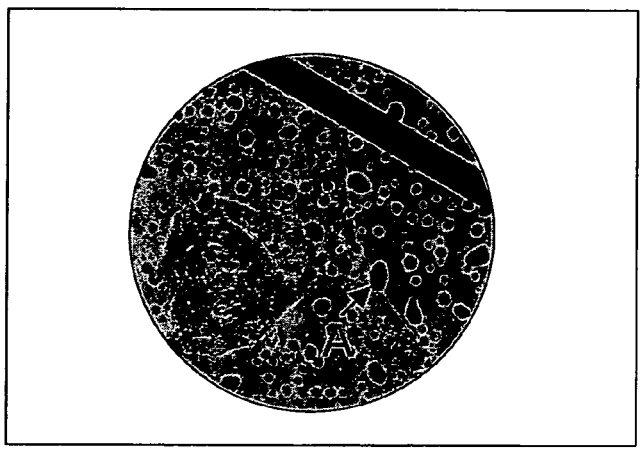
FIG. 5B is a photograph showing effects of application of the present invention to a selected area aperture, the figure being drawn using the experimental result shown in FIG. 4B.
Figure 5C:
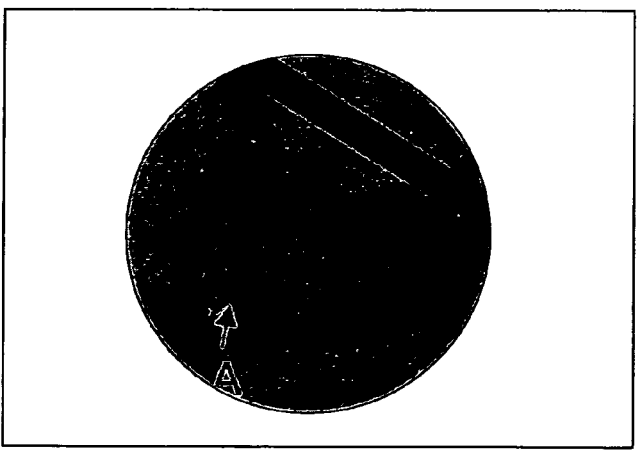
FIG. 5C is a photograph showing effects of application of the present invention to a selected area aperture, the figure being drawn using the experimental result shown in FIG. 4C.

FIGS. 5A through 5C are photographs each showing effects of application of the present invention to a selected area aperture, the figures being drawn using the experimental result shown in FIGS. 4A through 4C. To be more specific, FIGS. 5A through 5C show the experimental result acquired when the selected area aperture is placed at a position of the filament electrode $9_u$ of the upper electron biprism under the same conditions as those of the experiment shown in FIGS. 4A through 4C. If the selected area aperture is placed instead of the filament electrode $9_u$ of the upper electron biprism, a shadow of a filament may actually disappear in FIGS. 5A through 5C. However, FIGS. 5A through 5C are recorded with the filament shadow remaining therein for easier comparison between the experimental result in FIGS. 5A through 5C and that in FIGS. 4A through 4C.

As is the case with FIGS. 4A through 4C, FIGS. 5A through 5C also show that the gold fine particles become relatively smaller and at the same time the observed visual field becomes wider. On the other hand, because conditions of the optical system corresponding to the selected area aperture are constant, it can be easily understood that the size and position of the selected area aperture do not change. Therefore, according to the present invention, it becomes possible to use one aperture as a selected area aperture having the arbitrary size. Accordingly, the saved space can be used for a different mechanism, for example, an aperture foil heater or a shutter.

In addition, as is the case with the relationship between the above-mentioned filament electrode $9_u$ of the upper electron biprism and the specimen image, a relative azimuth rotation angle can also be controlled. Therefore, in comparison with the conventional method, it is easier to carry out experiments of not only normal circle apertures but also apertures having various shapes that are not rotational symmetry such as an oval and a quadrilateral.

(Proposal to Application)

(1) Selected Area Holography

As far as the electron holography is concerned, even if one of the conventional electron biprisms is used, or even in the case of PCT/JP2005/000111 in which two stages of biprism optical systems are used, a selected area aperture and an electron biprism cannot be used in combination (in other words, both of them cannot be simultaneously used) because the selected area aperture and the electron biprism are located at the same position, or at positions in proximity to each other, as optical systems. If anything, even if the shared use is possible (for example, there is a case where a selected area aperture is rebuilt to use the rebuilt selected area aperture as an electron biprism), it is impossible to use the selected area aperture and the electron biprism in combination. According to the present invention, because the objective lens is formed of two stages of lens systems, an image plane of a specimen (for example, the image plane 63 in FIG. 2) exists in the middle of the objective lens system. If a selected area aperture is placed on this surface, it becomes possible to handle the selected area aperture completely and independently of an electron biprism. This enables the use of both in combination.

(2) Application to Micro-Area Electron Diffraction

Usually, when micro-area electron diffraction is performed, an electron beam is narrowed down to generate a specified thin electron beam, and then a certain part of a specimen is irradiated with the electron beam to acquire an electron diffraction image. At this time, because an electron beam becomes a convergent beam by itself, a diffraction electron beam has the angle distribution, and accordingly a diffraction pattern is a circle image in which each diffraction spot spreads out. In addition, because a normal convergent beam is high current density, new problems which do not occur in the normal specimen image observation often occur. The new problems includes local heating of specimen, the damage of specimen, and the contamination of specimen, which are caused by electron beam irradiation.

According to the present invention, if a specimen image is sufficiently magnified relative to the aperture diameter, it is also easy to make a selected area aperture having a relatively microscopic diameter. Because the electron diffraction which uses this aperture having a microscopic diameter can be performed completely and independently of an electron beam with which a specimen is irradiated, the above problems including the local heating of specimen, the damage of specimen, and the contamination of specimen can be avoided in principle only by irradiation with the electron beam density that is completely the same as that at the time of normal specimen observation.

(3) Application to a High-Magnification Electron Microscopy

Figure 6:
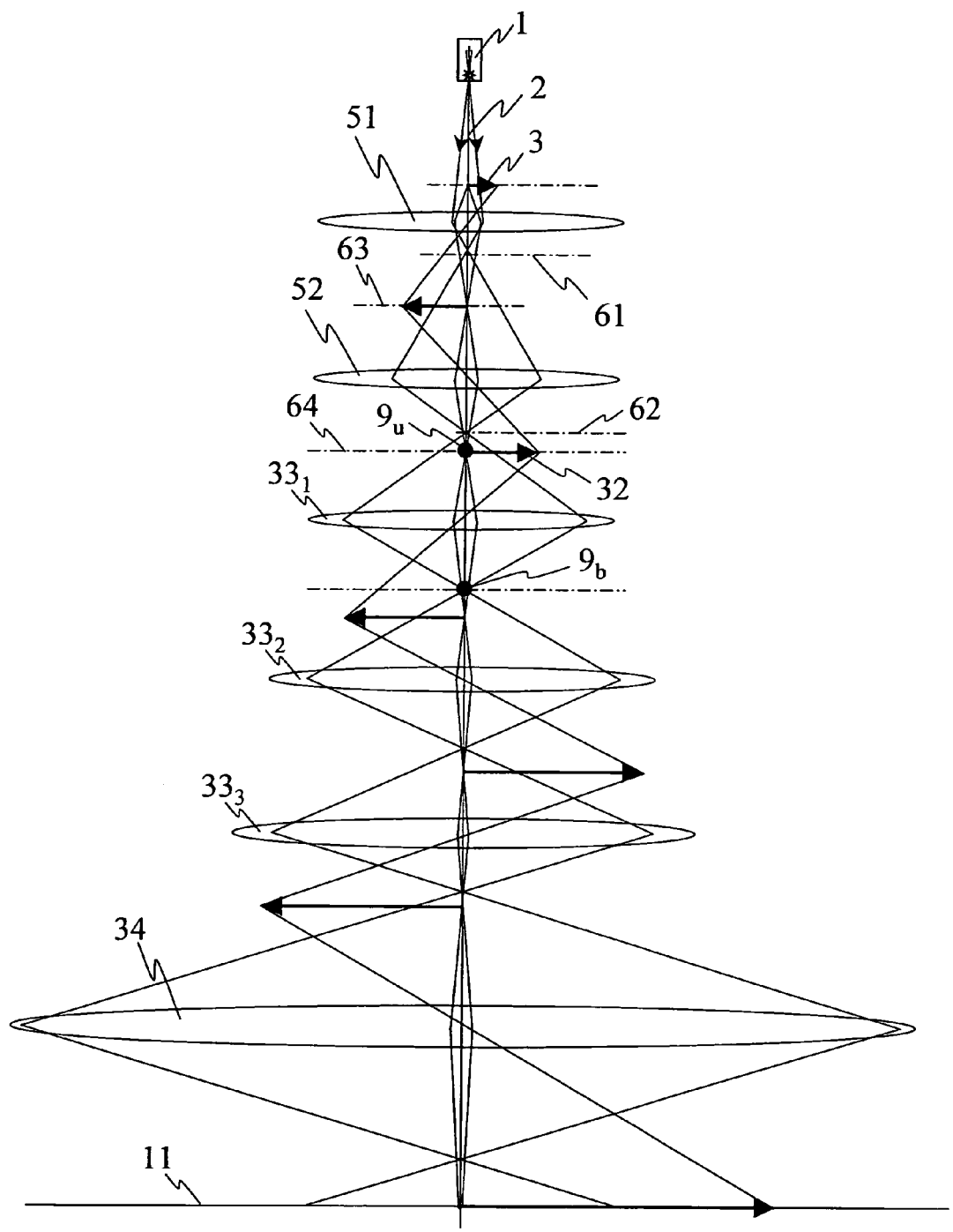
FIG. 6 is a diagram illustrating an optical system of an electron microscope, the optical system being configured to include four stages of magnification systems in which three stages of magnification optical systems $33_1$ through $33_3$ and one stage of projection lens 34 are placed on the downstream side of two stages of objective lenses 51 and 52.

A high-magnification electron microscope is assumed to be an electron microscope that has a configuration in which a two-stage objective lens according to the present invention is added to the upper part of a magnification optical system of a normal electron microscope. FIG. 6 is a diagram illustrating an optical system of an electron microscope, the optical system being configured to include four stages of magnification systems in which three stages of magnification optical systems $33_1$ through $33_3$ and one stage of projection lens 34 are placed at the downstream of two stages of objective lenses 51 and 52. Additionally, FIG. 6 only illustrates typical trajection of an electron beam emitted from the electron source 1 and typical trajection of an electron beam scattered at the tip and root position of a specimen 3. The undermentioned figures are also illustrated in like manner.

This means that the total number of lenses increases by one from that of normal electron microscopes. This makes it possible to increase the final magnification of an image by about ten times. More specifically, a magnification of 10,000,000 times can be achieved. Moreover, even if the first objective lens 51 is switched OFF at the time of observing, for example, a magnetic material, a magnification of about 100,000 times can be achieved. What is more, if a high performance lens is used for the second objective lens 52, the resolution in response to the performance can be achieved. In the case of the conventional electron microscopes, the final magnification was about 1,000,000 times. Furthermore, if the objective lens is switched OFF at the time of the magnetic field observation, the final magnification becomes 10,000 times or less. As a result, a minute specimen could not be observed. The present invention can avoid these constraints.

(4) Application to High-Resolution Electron Holography

If an optical system is so configured that a specimen is highly magnified with respect to a filament electrode of an electron biprism, the obtained interference fringe spacing becomes relatively very fine. Because the interference fringe spacing recorded by the holography determines the spatial resolution of a reconstructed image, what is important in the high-resolution holography and the crystal lattice image holography at an atom level is that fine fringes whose size is smaller than or equal to the atom size relative to a specimen image are generated and recorded.

According to the present invention, as described above, it is possible to adjust a specimen image to a filament electrode image by magnifying the relative magnification of the specimen. In addition to it, it is possible to generate fine fringes by independently controlling the interference fringe spacing. Moreover, because the total number of lenses increases, it is possible to record formed fine fringes after the fine fringes are sufficiently magnified.

Figure 7A:
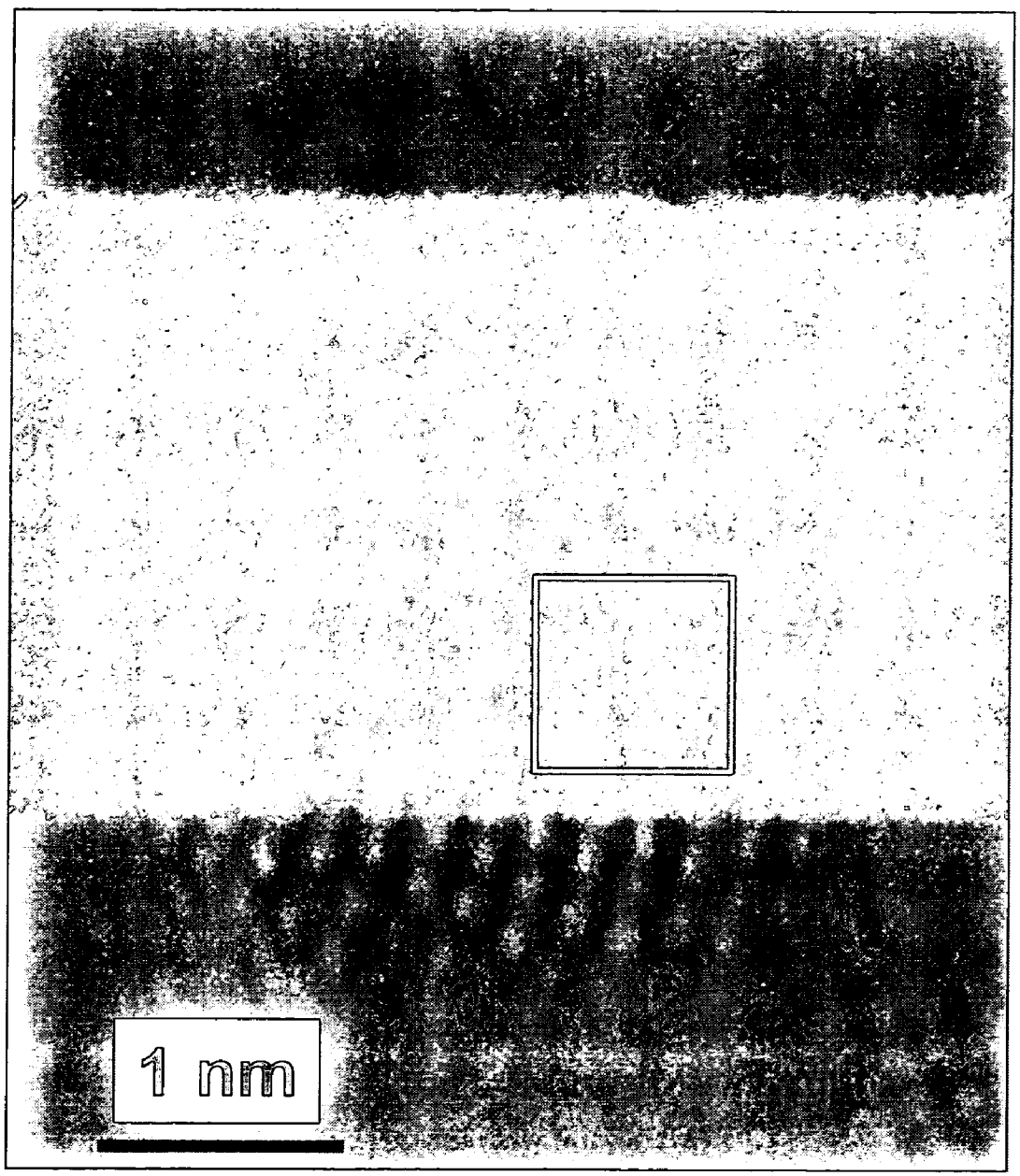
FIG. 7A is an image of gold fine particles on carbon thin film, the image being formed by high-resolution electron holography.

FIG. 7A is a photograph of a gold fine particles on carbon thin film. White spots which are regularly arranged are a lattice image of a gold crystal. A position of each white spot corresponds to a single atom position. The crystal arrangement is five-times symmetric arrangement with the center of fine particles being defined as a symmetry axis. This is the decahedron structure having a typical fine particle shape of face-centered cubic crystal such as gold. A region located in the center of fine particles, which looks like a band, is an interference region that is configured in this experiment. About 600 interference fringes are generated in this interference region.

Figure 7B:
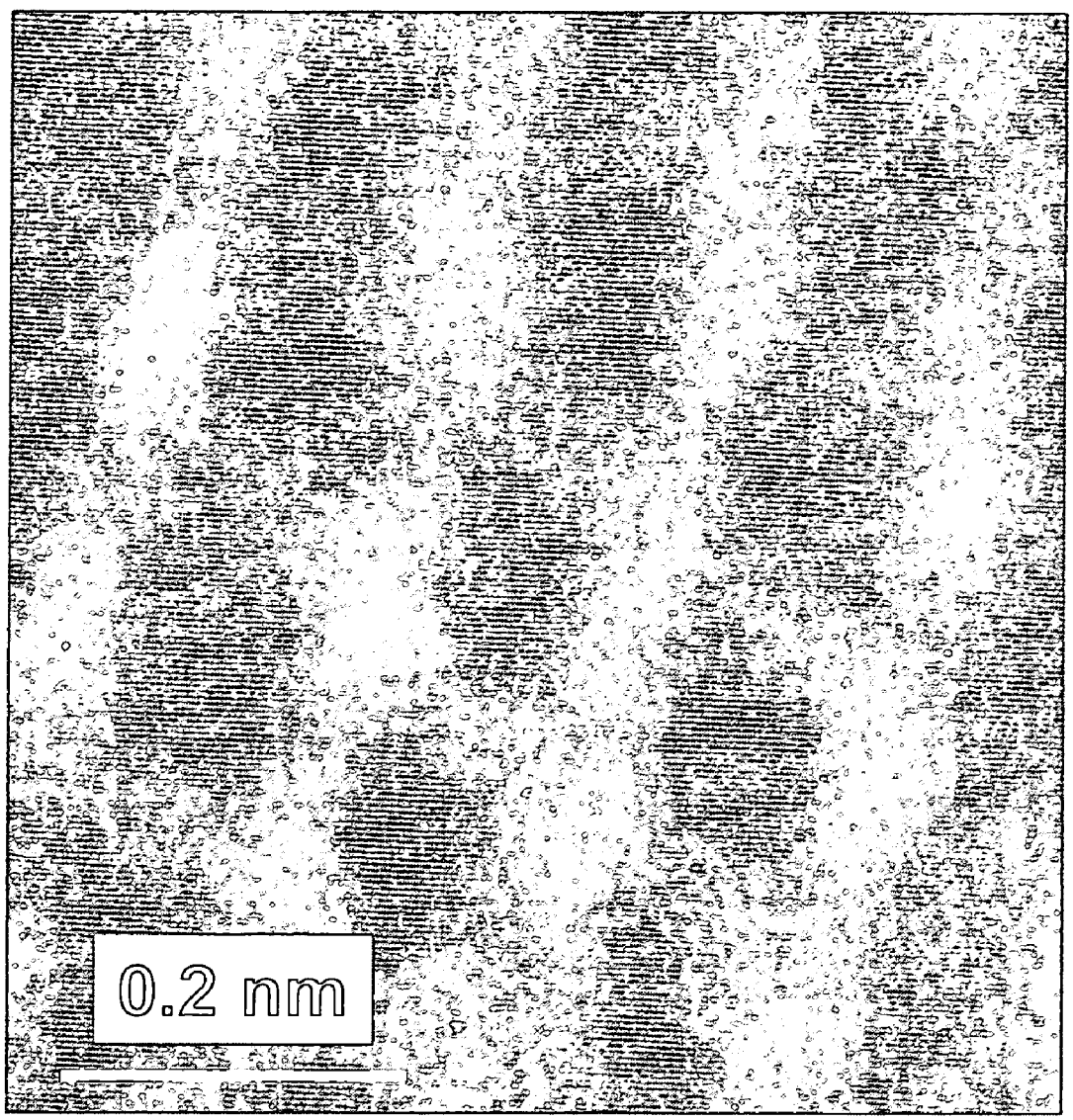
FIG. 7B is an enlarged image of an area surrounded by a frame shown in FIG. 7A.

FIG. 7B is an enlarged image of an area surrounded by a frame shown in FIG. 7A. About 40 interference fringes are recorded in one atom image of gold (interference fringe spacing: about 5 pm (picometer)). A carrier-spatial frequency by the interference fringes is about $200 \text{ nm}^{-1}$, which sufficiently exceeds a resolution limit ($20 \text{ nm}^{-1}$) within which the ordinary objective lens of the electron microscope can transfer information. To be more specific, if the high-resolution holography based on such fine interference fringes is used, mixture of information (superimposition of an auto-correlation function of an object image on an object wave function) does not occur at the time of hologram reconstruction. As a result, image processing such as image reconstruction strictly only from an object wave, and aberration correction of an electron lens by the image reconstruction becomes possible.

(5) Application to Three-Stage Objective Lens Optical System

Figure 8:
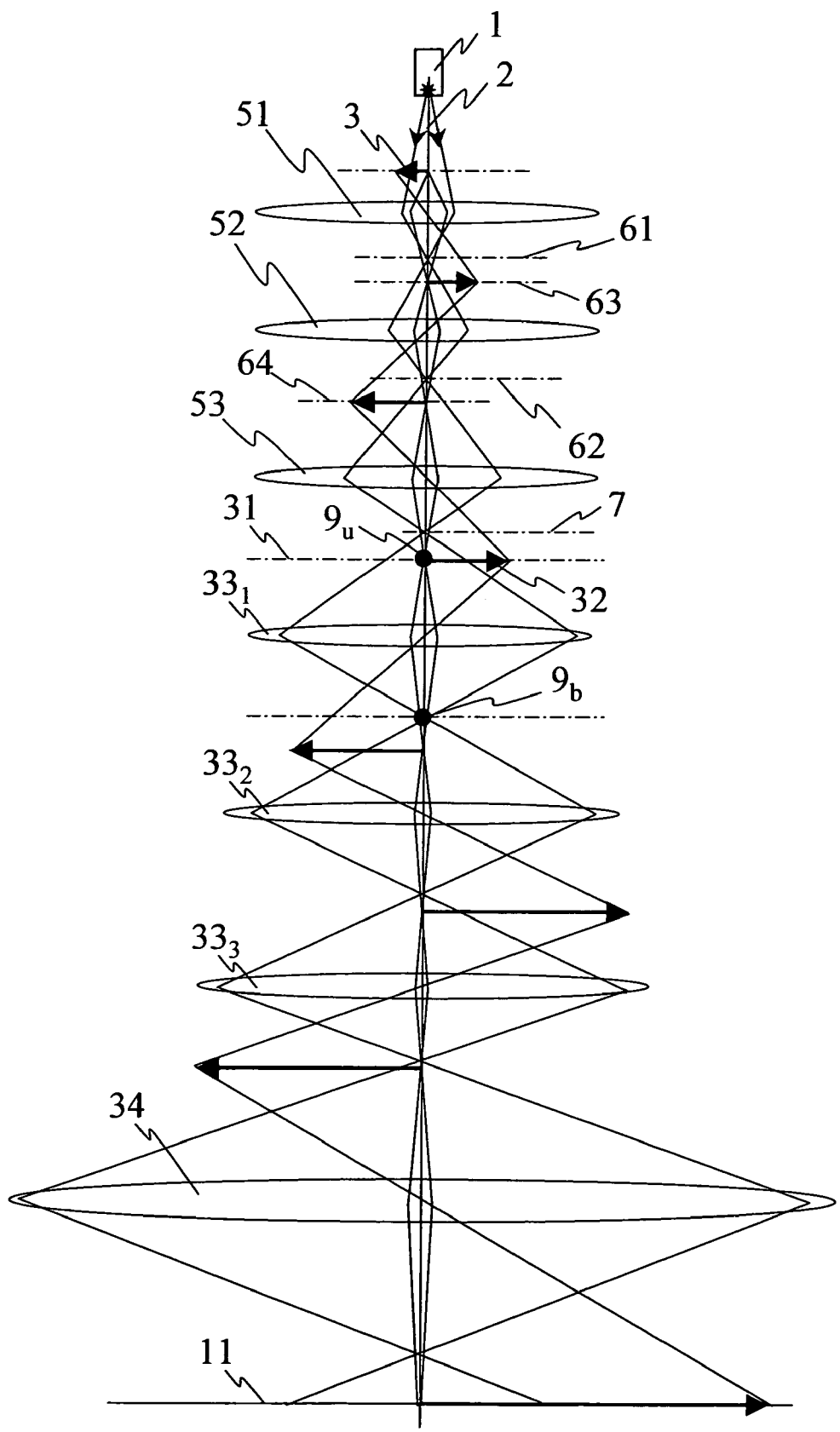
FIG. 8 is a diagram illustrating, as an application example of the present invention, an optical system in which an objective lens is formed of three stages of lens systems.

If the present invention is developed and applied further, it is possible to devise an optical system whose objective lens is formed of three stages of lens systems. FIG. 8 is a diagram schematically illustrating this optical system. This optical system takes advantage of not only an increase in the relative magnification relative to a filament electrode of an electron biprism or a selected area aperture, and a further increase in the maximum final magnification, the increases being achieved by the increase in the number of lenses, but also a further increase in flexibility of a construction of an optical system as a result of adding a lens. To be more specific, it becomes possible to freely control a relative azimuth angle between the filament electrode and the specimen with the relative magnification relative to the filament electrode of the electron biprism or the selected area aperture being kept in an arbitrary state. Even if the specimen, the filament electrode, or the selected area aperture does not include an azimuth rotating mechanism, it becomes possible to carry out experiments that sufficiently satisfy requirements.

Figure 9:
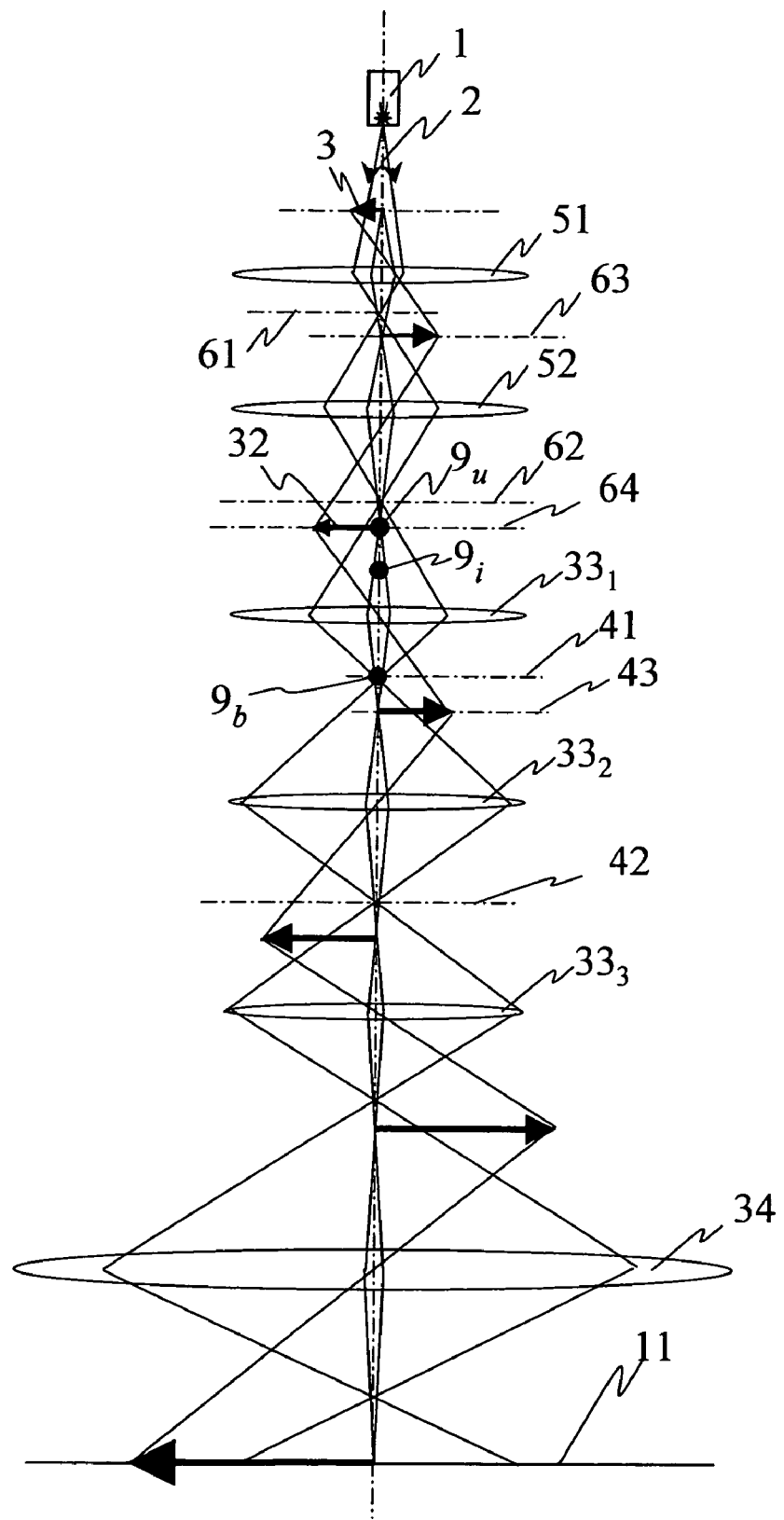
FIG. 9 is a diagram illustrating, as an example, an optical system of a holography microscope, the optical system including an upper biprism, a third middle biprism, and a lower biprism.

(6) Example of Application that Uses Three Stages of Biprisms and Four Stages of Biprisms FIG. 9 is a diagram illustrating, as an example, an optical system of a holography microscope, the optical system including an upper biprism, a third middle biprism, and a lower biprism. Similar reference numerals are used in FIG. 9 to designate parts that are similar to those shown in FIG. 6, or to designate parts that function in a similar manner to those shown in FIG. 6. In this example, the filament electrode $9_u$ of the upper electron biprism is placed on an image plane 64 of a specimen, which is formed by the second objective lens 52, and the filament electrode $9_i$ of the middle electron biprism is placed at the upper part of the first magnifying lens $33_1$. The filament electrode $9_b$ of the lower electron biprism is placed on an image plane 41 of the source, which is formed by the first magnifying lens $33_1$. A specimen image 32 is magnified and projected in succession by the first magnifying lens $33_1$, and then by a second magnifying lens $33_2$. The specimen image 32 is further magnified by a third magnifying lens $33_3$ and a projection lens 34, and thereby a final magnified image is acquired on an observation plane 11.

In the example shown in FIG. 9, the interference fringe spacing s can be changed by changing the voltage of the filament electrode $9_u$ of the upper electron biprism or that of the filament electrode $9_i$ of the middle electron biprism. Therefore, it is possible to reduce the voltage of the filament electrode $9_u$ of the upper electron biprism and that of the filament electrode $9_i$ of the middle electron biprism, which is advantageous from the viewpoint of the withstanding voltage. As described in PCT/JP2005/000111, besides the above example, there may be other cases of a position at which the filament electrode $9_i$ of the middle electron biprism is placed.

Figure 10:
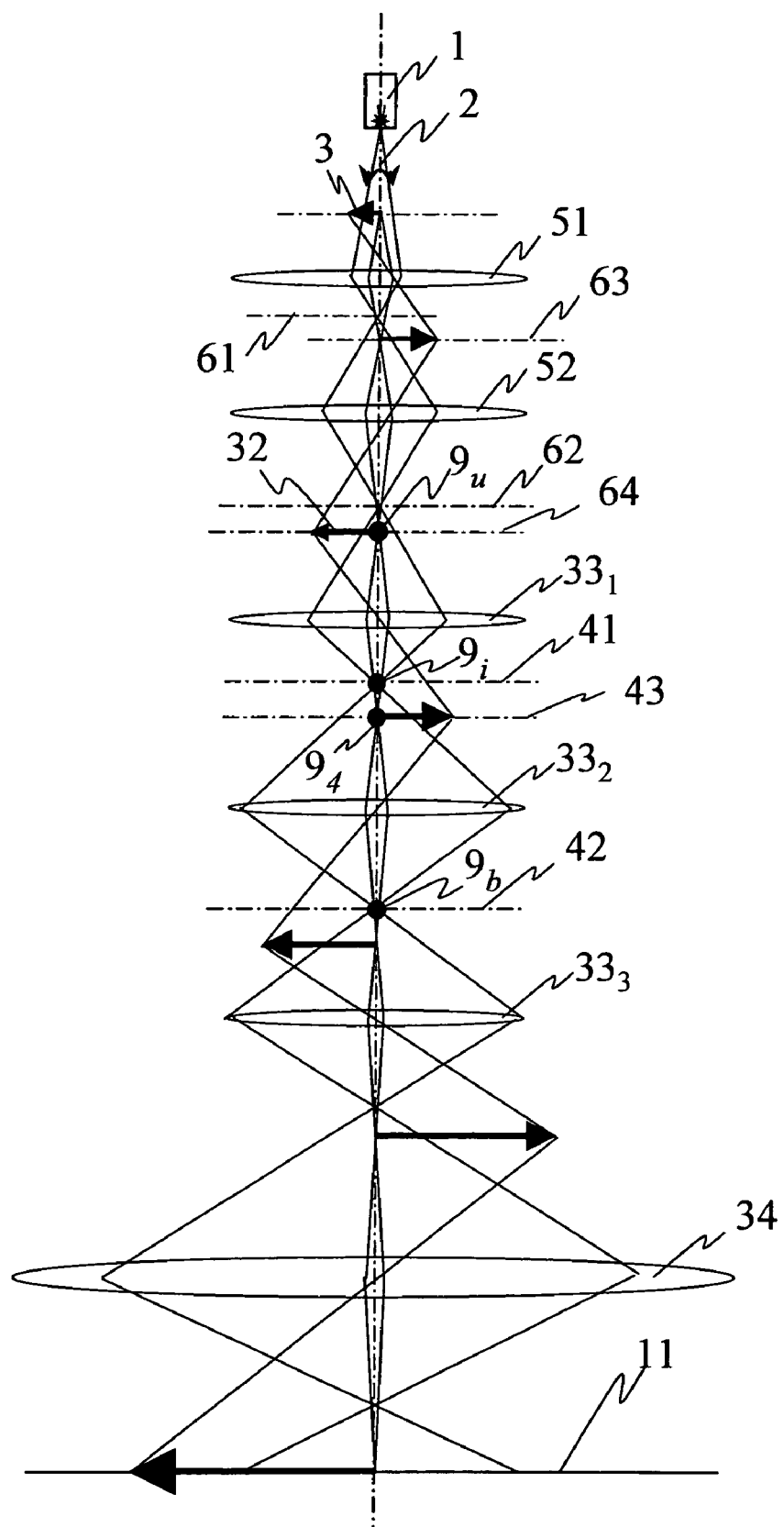
FIG. 10 is a diagram illustrating, as an example, an optical system of a holography microscope that uses not only the third middle biprism shown in FIG. 9 but also a fourth biprism.

FIG. 10 is a diagram illustrating, as an example, an optical system of a holography microscope that uses not only the third middle biprism shown in FIG. 9 but also a fourth biprism. The filament electrode $9_u$ of the upper electron biprism is placed on an image plane 64 of the second objective lens 52, and the filament electrode $9_i$ of the middle biprism is placed on an image plane 41 of a source under the first magnifying lens $33_1$. The filament electrode $9_b$ of the lower biprism is placed on an image plane 42 of a source under the second magnifying lens $33_2$; and the filament electrode $9_4$ of the fourth biprism is placed on an image plane 43 of a specimen, which is formed by the first magnifying lens $33_1$. A target of the voltage control for changing the interference fringe spacing s can be divided into the filament electrode $9_u$ of the upper biprism and the filament electrode $9_4$ of the fourth biprism. In addition to it, a target of the voltage control for changing the interference width W can also be divided into the filament electrode $9_b$ of the lower biprism and the filament electrode $9_i$ of the middle biprism. Accordingly, it is possible to reduce the voltage of the filament electrode of each biprism, which is advantageous from the viewpoint of the withstanding voltage.

According to the present invention, in addition to the effects of the invention of PCT/JP2005/000111, it is possible to arbitrarily control the magnification control interference width and interference fringe spacing of the two-stage objective lens of an electron beam. Therefore, as is the case with the invention of PCT/JP2005/000111, the following applications are possible:

(7) measurement of spatial coherence (degree of coherence) of an electron beam, and calculation of the brightness;

(8) observation of temporal coherence;

(9) generation of high carrier-spatial frequency hologram; and

(10) generation of quantum wire and quantum dots

INDUSTRIAL APPLICABILITY

According to the present invention, it is possible to realize an interferometer that is capable of arbitrarily controlling the width of an unobservable area only by adjusting an objective lens of the electron interferometer, and to realize an electron microscope that is capable of freely setting a diameter of a selected area aperture.

DESCRIPTION OF REFERENCE NUMBERS

1: Electron source,
2: Optical axis,
3: Specimen,
5: Objective lens,
7: Image plane of electron source over a filament electrode of an upper electron biprism,
$9_u$: Filament electrode of an upper electron biprism,
$9_b$: Filament electrode of a lower electron biprism,
$9_i$: Filament electrode of a third electron biprism,
$9_4$: Filament electrode of a fourth electron biprism,
11: Observation plane, 12: Specimen image on the observation plane 11, 13: Image recording device such as film and a camera, 21: Object wave, 23: Reference wave, 25, 27: Positions of a virtual electron source (virtual image of an electron source) on an image plane 35 of an electron source determined by a magnifying lens 33,
26, 28: Real images of an electron source on the image plane 35 of the electron source formed by the magnifying lens 33,
31: Image plane of a specimen determined by an objective lens or an objective lens system,
32: Specimen image formed by an objective lens or an objective lens system,
33: Magnifying lens,
$33_1$: First magnifying lens, $33_2$: Second magnifying lens,
$33_3$: Third magnifying lens,
34: Projection lens,
35: Image plane of an electron source determined by the magnifying lens 33,
41: Image plane of an electron source determined by the first magnifying lens $33_1$,
42: Image plane of an electron source determined by the second magnifying lens $33_2$,
43: Image plane of a specimen determined by the first magnifying lens $33_1$,
51: First objective lens,
52: Second objective lens,
53: Third objective lens,
61: Image plane of an electron source determined by the first objective lens,
62: Image plane of an electron source determined by the second objective lens,
63: Image plane of a specimen determined by the first objective lens,
64: Image plane of a specimen determined by the second objective lens,
$a_1$: Distance between the objective lens 5 or the first objective lens 51 and the electron source 1,
$a_2$: Distance between the second objective lens 52 and the image plane 61 of an electron source,
$a_3$: Distance between the magnifying lens 33 and the image plane 7 of an electron source,
$a_{Obj}$: Distance between the objective lens 5 and the specimen 3,
$a_{Obj1}$: Distance between the first objective lens 51 and the specimen 3,
$a_{Obj2}$: Distance between the second objective lens 52 and the image plane 63 of a specimen,
$a_M$: Distance between the magnifying lens 33 and the image plane 31 of the specimen,
$b_1$: Distance between the objective lens 5 or the first objective lens 51 and the image plane 7 or 61 of the electron source,
$b_2$: Distance between the second objective lens 52 and the image plane 7 of an electron source,
$b_3$: Distance between the magnifying lens 33 and the image plane 35 of the electron source determined by the magnifying lens 33,
$b_{Obj}$: Distance between the objective lens 5 and the image plane 31 of the specimen,
$b_{Obj1}$: Distance between the first objective lens 51 and the image plane 63 of the specimen,
$b_{Obj2}$: Distance between the second objective lens 52 and the image plane 31 of the specimen,
$b_M$: Distance between the magnifying lens 33 and the observation plane 11,
$\lambda$: Wavelength of an electron beam emitted from the electron source 1,
$\alpha_u$: Deflection angle of an electron beam by the filament electrode $9_u$ of the upper electron biprism,
$\alpha_b$: Deflection angle of an electron beam by the filament electrode $9_b$ of the lower electron biprism, $L_b$: Distance between the filament electrode $9_b$ of the lower electron biprism and the observation plane 11, $D_u$: Distance between the image plane 7 of an electron source over the filament electrode $9_u$ of the upper electron biprism and the image plane 31 of the specimen determined by an objective lens, $D_b$: Distance between the image plane 35 of the electron source determined by the magnifying lens 33 and the observation plane 11, $d_u$: Diameter of the filament electrode $9_u$ of the upper electron biprism, $d_b$: Diameter of the filament electrode $9_b$ of the lower electron biprism, $M_{obj}$: Magnification for a specimen achieved by the objective lens 5 or the objective lens system (the first objective lens 51 and the second objective lens 52), $M_{Obj1}$: Magnification for a specimen achieved by the first objective lens 51, $M_{Obj2}$: Magnification achieved by the second objective lens 52 relative to an image formed on the image plane 63 by the first objective lens 51, $M_M$: Magnification for a specimen image 32 formed by the magnifying lens 33.

What is claimed is:

1. An electron interferometer comprising:
   a source of an electron beam;
   a condenser optical system for irradiating a specimen with the electron beam emitted from the source;
   a specimen holder for holding the specimen that is irradiated with the electron beam;
   an imaging lens system for imaging the specimen; and
   a device for observing or recording the specimen image; wherein:
   an objective lens of the imaging lens system, which is located on the downstream side in a traveling direction of an electron beam relative to a position at which the specimen is placed on an optical axis of an electron beam, is a lens formed of two stages of lens systems whose focal length can be independently controlled, said objective lens including:
   an upper biprism located in a plane that is orthogonal to an optical axis at a position of an image plane of the specimen, said image plane being determined on the downstream side of the objective lens formed of the two stages of lens systems; and
   a lower biprism located in a plane that is parallel to the plane in which the upper biprism is located on the downstream side in a traveling direction of an electron beam relative to a position of the upper biprism on the optical axis through one or a plurality of lenses among the imaging lens systems; and
   by independently applying the voltage to each of the upper biprism and the lower biprism, an electron beam is deflected in an identical plane of an electron optical system including an optical axis, said deflection plane.

2. The electron interferometer according to claim 1, wherein:
   by adjusting each lens system of the objective lens formed of the two stages of lens systems, an image of the specimen is imaged at arbitrary magnification on the plane in which the upper biprism is located, said image plane being orthogonal to the optical axis.

3. The electron interferometer according to claim 1, wherein:
   on the downstream side of one or a plurality of imaging lenses that are located on the downstream side in a traveling direction of an electron beam relative to the upper biprism, said lower biprism is located on the downstream side of a source image formed by the imaging lens or the plurality of imaging lenses.

4. The electron interferometer according to claim 1, wherein:
   on the downstream side of one or a plurality of imaging lenses that are located on the downstream side in a traveling direction of an electron beam relative to the upper biprism, said lower biprism is located on an image plane of the source, which is formed by the imaging lens or the plurality of imaging lenses.

5. The electron interferometer according to claim 1, wherein:
   on the downstream side of one or a plurality of imaging lenses that are located on the downstream side in a traveling direction of an electron beam relative to the upper biprism, said lower biprism is located between the one or a plurality of imaging lenses and an image plane of the source, which are formed by the imaging lenses or the plurality of imaging lenses.

6. The electron interferometer according to claim 1, further comprising:
   a third biprism that is located on the downstream side in a traveling direction of an electron beam relative to the upper biprism, and that is placed in a plane orthogonal to the optical axis so that independently applying the voltage to each of the upper biprism and the lower biprism causes an electron beam to be deflected in the same plane as the deflection in an identical plane including the optical axis of an electron optical system of the electron beam, said third biprism causing an electron beam to be deflected in the same deflection plane including the optical axis of the electron beam, and to be deflected independently of both of the upper and lower biprisms by applying the voltage to the third biprism independently of both of the upper and lower biprisms.

7. The electron interferometer according to claim 1, further comprising:
   a third biprism that is located on the downstream side in a traveling direction of an electron beam relative to the upper biprism, and that is placed in a plane orthogonal to the optical axis so that independently applying the voltage to each of the upper biprism and the lower biprism causes an electron beam to be deflected in the same plane as the deflection in an identical plane including the optical axis of an electron optical system of the electron beam, said third biprism being capable of independently causing an electron beam to be deflected in the same deflection plane including the optical axis by applying the voltage independently of both of the upper and lower biprisms; and
   a fourth biprism that is placed in a plane orthogonal to the optical axis so that the electron beam is deflected in the same deflection plane including the optical axis of the electron beam, and that is capable of independently causing the electron beam to be deflected by applying the voltage independently of said three biprisms.

8. An electron interferometer comprising:
   a source of an electron beam;
   a condenser optical system for irradiating a specimen with the electron beam emitted from the source;
   a specimen holder for holding the specimen that is irradiated with the electron beam;
   an imaging lens system for imaging the specimen; and
   a device for observing or recording the specimen image; wherein:

an objective lens of the imaging lens system, which is located on the downstream side in a traveling direction of an electron beam relative to a position at which the specimen is placed on an optical axis of the electron beam, is a lens system formed of a plurality of stages (three or more stages) of lenses whose focal length can be independently controlled, said objective lens including:

an upper biprism located in a plane that is orthogonal to an optical axis at a position of an image plane of the specimen, said image plane being formed on the downstream side of the objective lens formed of the plurality of stages of the imaging lens systems; and a lower biprism located in a plane that is parallel to the plane in which the upper biprism is located on the downstream side in a traveling direction of an electron beam relative to a position of the upper biprism on the optical axis through one or a plurality of lenses among the imaging lens systems; and by independently applying the voltage to each of the upper biprism and the lower biprism, an electron beam is deflected in the same plane of an electron optical system including the optical axis, said deflection plane.

9. The electron interferometer according to claim 8, wherein:

by adjusting each lens system of the objective lens formed of the plurality of stages of the imaging lens systems, an image of the specimen is imaged at arbitrary magnification on a plane in which the upper biprism is located, said plane being orthogonal to the optical axis.

10. The electron interferometer according to claim 8, further comprising:

a third biprism that is located on the downstream side in a traveling direction of an electron beam relative to the upper biprism, and that is placed in a plane orthogonal to the optical axis so that independently applying the voltage to each of the upper biprism and the lower biprism causes an electron beam to be deflected in the same deflection plane including an optical axis of an electron optical system of the electron beam, said third biprism being capable of independently causing an electron beam to be deflected in the deflection plane by applying the voltage independently of both of the upper and lower biprisms.

11. The electron interferometer according to claim 8, further comprising:

a third biprism that is located on the downstream side in a traveling direction of an electron beam relative to the upper biprism, and that is placed in a plane orthogonal to the optical axis so that independently applying the voltage to each of the upper biprism and the lower biprism causes an electron beam to be deflected in the same deflection plane including an optical axis of an electron optical system of the electron beam, said third biprism being capable of independently causing an electron beam to be deflected in the same deflection plane by applying the voltage independently of both of the upper and lower biprisms; and a fourth biprism that is placed in a plane orthogonal to the optical axis so that the electron beam is deflected in the same deflection plane including the optical axis of the electron beam, and that is capable of independently causing the electron beam to be deflected by applying the voltage independently of said three biprisms.

12. An electron microscope comprising:
a source of an electron beam;
a condenser optical system for irradiating a specimen with the electron beam emitted from the source;
a specimen holder for holding the specimen that is irradiated with the electron beam;
an imaging lens system for imaging the specimen; and
a device for observing or recording the specimen image; wherein:

an objective lens of the imaging lens system, which is located on the downstream side in a traveling direction of an electron beam relative to a position at which the specimen is placed on an optical axis of the electron beam, is formed of two stages of the imaging lens systems whose focal length can be independently controlled, said objective lens; and on the downstream side in a traveling direction of the electron beam of the two stages of the imaging lens systems on an optical axis, there is provided a device for holding an aperture capable of limiting an area through which the electron beam passes, and for moving the aperture in a plane orthogonal to the optical axis.

13. The electron microscope according to claim 12, wherein:

a device for holding an aperture capable of limiting an area through which the electron beam passes, and for moving the aperture in a plane orthogonal to the optical axis or in a direction of the optical axis, is located on an image plane of the specimen, said image plane being formed by the objective lens system formed of the two stages of the imaging lens systems.

14. The electron microscope according to claim 12, wherein:

by adjusting each lens system of the objective lens formed of the two stages of lens systems, an image of the specimen is imaged at arbitrary magnification in an aperture capable of limiting an area through which the electron beam passes, or in a plane orthogonal to the optical axis where the aperture is located.

15. The electron interferometer according to claim 1, comprising:

a source of an electron beam;
a condenser optical system for irradiating a specimen with the electron beam emitted from the source;
a specimen holder for holding the specimen that is irradiated with the electron beam;
an imaging lens system for imaging the specimen; and
a device for observing or recording the specimen image; wherein:

an objective lens of the imaging lens system, which is located on the downstream side in a traveling direction of an electron beam relative to a position at which the specimen is placed on an optical axis of the electron beam, is formed of two stages of the imaging lens systems whose focal length can be independently controlled; and in a traveling direction of an electron beam, between the two stages of the objective lens on an optical axis, there is provided a device for holding an aperture capable of limiting an area through which an electron beam passes, and for moving the aperture in a plane orthogonal to the optical axis.

16. The electron interferometer according to claim 1, wherein:

a lens system located on the upstream side in a traveling direction of an electron beam of an objective lens formed of two stages of the imaging lens systems images the specimen in an aperture capable of limiting an area through which the electron beam passes, or in a plane orthogonal to the optical axis where the aperture is located.

17. The electron interferometer according to claim 1, comprising:
- a source of an electron beam;
- a condenser optical system for irradiating a specimen with the electron beam emitted from the source;
- a specimen holder for holding the specimen that is irradiated with the electron beam;
- an imaging lens system for imaging the specimen; and
- a device for observing or recording the specimen image; wherein:
- an objective lens of the imaging lens system, which is located on the downstream side in a traveling direction of an electron beam relative to a position at which the specimen is placed on an optical axis of the electron beam, is formed of a plurality of stages (three or more stages) of lens systems whose focal length can be independently controlled; and
- on the downstream side in a traveling direction of the electron beam of the plurality of stages of the imaging lens systems on an optical axis, there is provided a device for holding an aperture capable of limiting an area through which the electron beam passes, and for moving the aperture in a plane orthogonal to the optical axis.

18. The electron interferometer according to claim 1, wherein:
- the objective lens formed of a plurality of stages of the imaging lens systems images the specimen in an aperture capable of limiting an area through which the electron beam passes, or in a plane orthogonal to the optical axis where the aperture is located.

19. The electron interferometer according to claim 1, wherein:
- by adjusting each lens system of the objective lens formed of the plurality of stages of the imaging lens systems, an image of the specimen is projected at arbitrary magnification in an aperture capable of limiting an area through which the electron beam passes, or in a plane orthogonal to the optical axis where the aperture is located.

20. The electron interferometer according to claim 1, comprising:
- a source of an electron beam;
- a condenser optical system for irradiating a specimen with the electron beam emitted from the source;
- a specimen holder for holding the specimen that is irradiated with the electron beam;
- an imaging lens system for imaging the specimen; and
- a device for observing or recording the specimen image; wherein:
- an objective lens of the imaging lens system, which is located on the downstream side in a traveling direction of an electron beam relative to a position at which the specimen is placed on an optical axis of the electron beam, is formed of a plurality of stages (three or more stages) of the imaging lens systems whose focal length can be independently controlled; and
- in a traveling direction of an electron beam, between any two lenses among the plurality of stages of lenses on an optical axis, there is provided a device for holding an aperture capable of limiting an area through which an electron beam is transmitted, and for moving the aperture in a plane orthogonal to the optical axis.

21. The electron interferometer according to claim 1, wherein:
- among the plurality of stages of the imaging lens systems forming the objective lens, by use of one or more stages of lens systems that are located on the upstream side in a traveling direction of an electron beam relative to a plane orthogonal to an optical axis where an aperture capable of limiting an area through which the electron beam passes is located, an image of the specimen is imaged in the aperture or in a plane orthogonal to the optical axis where the aperture is located.

22. The electron interferometer according to claim 1, wherein:
- among the plurality of stages of the imaging lens systems forming the objective lens, by adjusting each of lens systems that are located on the upstream side in a traveling direction of an electron beam relative to a plane orthogonal to an optical axis where an aperture capable of limiting an area through which the electron beam passes is located, an image of the specimen is imaged at arbitrary magnification in the aperture or in a plane orthogonal to the optical axis where the aperture is located.

23. The electron interferometer according to claim 8, comprising:
- a source of an electron beam;
- a condenser optical system for irradiating a specimen with the electron beam emitted from the source;
- a specimen holder for holding the specimen that is irradiated with the electron beam;
- an imaging lens system for imaging the specimen; and
- a device for observing or recording the specimen image; wherein:
- an objective lens of the imaging lens system, which is located on the downstream side in a traveling direction of an electron beam relative to a position at which the specimen is placed on an optical axis of the electron beam, is formed of two stages of the imaging lens systems whose focal length can be independently controlled; and
- in a traveling direction of an electron beam, between the two stages of the objective lens on an optical axis, there is provided a device for holding an aperture capable of limiting an area through which an electron beam passes, and for moving the aperture in a plane orthogonal to the optical axis.

24. The electron interferometer according to claim 8, wherein:
- a lens system located on the upstream side in a traveling direction of an electron beam of an objective lens formed of two stages of the imaging lens systems images the specimen in an aperture capable of limiting an area through which the electron beam passes, or in a plane orthogonal to the optical axis where the aperture is located.

25. The electron interferometer according to claim 8, comprising:
- a source of an electron beam;
- a condenser optical system for irradiating a specimen with the electron beam emitted from the source;
- a specimen holder for holding the specimen that is irradiated with the electron beam;
- an imaging lens system for imaging the specimen; and
- a device for observing or recording the specimen image; wherein:
- an objective lens of the imaging lens system, which is located on the downstream side in a traveling direction of an electron beam relative to a position at which the specimen is placed on an optical axis of the electron beam, is formed of a plurality of stages (three or more stages) of lens systems whose focal length can be independently controlled; and
- on the downstream side in a traveling direction of the electron beam of the plurality of stages of the imaging lens systems on an optical axis, there is provided a device for holding an aperture capable of limiting an area through which the electron beam passes, and for moving the aperture in a plane orthogonal to the optical axis.

26. The electron interferometer according to claim 8, wherein:
the objective lens formed of a plurality of stages of the imaging lens systems images the specimen in an aperture capable of limiting an area through which the electron beam passes, or in a plane orthogonal to the optical axis where the aperture is located.

27. The electron interferometer according to claim 8, wherein:
by adjusting each lens system of the objective lens formed of the plurality of stages of the imaging lens systems, an image of the specimen is projected at arbitrary magnification in an aperture capable of limiting an area through which the electron beam passes, or in a plane orthogonal to the optical axis where the aperture is located.

28. The electron interferometer according to claim 8, comprising:
a source of an electron beam;
a condenser optical system for irradiating a specimen with the electron beam emitted from the source;
a specimen holder for holding the specimen that is irradiated with the electron beam;
an imaging lens system for imaging the specimen; and
a device for observing or recording the specimen image; wherein:
an objective lens of the imaging lens system, which is located on the downstream side in a traveling direction of an electron beam relative to a position at which the specimen is placed on an optical axis of the electron beam, is formed of a plurality of stages (three or more stages) of the imaging lens systems whose focal length can be independently controlled; and
in a traveling direction of an electron beam, between any two lenses among the plurality of stages of lenses on an optical axis, there is provided a device for holding an aperture capable of limiting an area through which an electron beam is transmitted, and for moving the aperture in a plane orthogonal to the optical axis.

29. The electron interferometer according to claim 8, wherein:
among the plurality of stages of the imaging lens systems forming the objective lens, by use of one or more stages of lens systems that are located on the upstream side in a traveling direction of an electron beam relative to a plane orthogonal to an optical axis where an aperture capable of limiting an area through which the electron beam passes is located, an image of the specimen is imaged in the aperture or in a plane orthogonal to the optical axis where the aperture is located.

30. The electron interferometer according to claim 8, wherein:
among the plurality of stages of the imaging lens systems forming the objective lens, by adjusting each of lens systems that are located on the upstream side in a traveling direction of an electron beam relative to a plane orthogonal to an optical axis where an aperture capable of limiting an area through which the electron beam passes is located, an image of the specimen is imaged at arbitrary magnification in the aperture or in a plane orthogonal to the optical axis where the aperture is located.

* * * * *